United States Patent [19]

Shirahata et al.

[11] 4,089,993

[45] May 16, 1978

[54] METHOD OF FORMING A METALLIC THIN FILM BY ELECTROLESS PLATING ON A VINYLIDENE CHLORIDE UNDERCOAT

[75] Inventors: Ryuji Shirahata; Masaaki Suzuki; Yasuyuki Yamada; Tatsuji Kitamoto; Shin-ichiro Dezawa, all of Odawara, Japan

[73] Assignee: Fuji Photo Film Co., Ltd., Japan

[21] Appl. No.: 733,920

[22] Filed: Oct. 19, 1976

[30] Foreign Application Priority Data

Oct. 21, 1975 Japan .................. 50-125915

[51] Int. Cl.$^2$ .............................. C23C 3/02
[52] U.S. Cl. ................... 427/129; 427/131; 427/132; 427/306; 427/404
[58] Field of Search ............... 427/404, 306, 131, 132, 427/129; 428/461, 900

[56] References Cited

U.S. PATENT DOCUMENTS

| | | | |
|---|---|---|---|
| 3,011,920 | 12/1961 | Shipley | 427/304 X |
| 3,238,061 | 3/1966 | Koretzky et al. | 427/306 X |
| 3,698,929 | 10/1972 | Diebold et al. | 427/404 X |
| 4,005,238 | 1/1977 | Gaehde et al. | 427/404 X |

FOREIGN PATENT DOCUMENTS

| | | | |
|---|---|---|---|
| 2,071,494 | 9/1971 | France | 427/131 |
| 861,710 | 2/1961 | United Kingdom | 427/132 |

*Primary Examiner*—Ralph S. Kendall
*Attorney, Agent, or Firm*—Armstrong, Nikaido, Marmelstein & Kubovcik

[57] ABSTRACT

This invention relates to a method of forming a metallic thin film on a plastic substrate by electroless plating, which comprises providing an undercoated layer consisting essentially of polyvinylidene chloride or vinylidene chloride copolymer on the surface of the plastic substrate and then subjecting to a surface activating treatment and electroless plating.

12 Claims, No Drawings

METHOD OF FORMING A METALLIC THIN FILM BY ELECTROLESS PLATING ON A VINYLIDENE CHLORIDE UNDERCOAT

BACKGROUND OF THE INVENTION

1. FIELD OF THE INVENTION

This invention relates to a method for the electroless plating of a plastic substrate and more particularly, it is concerned with a method of forming a metallic thin film excellent in adhesiveness and surface smoothness on a plastic substrate by electroless plating.

2. DESCRIPTION OF THE PRIOR ART

The electroless plating technique has widely been employed as a method of forming a metallic thin film on the surface of an electrically non-conductive substrate. The electroless plating technique means a chemical reduction plating method wherein a metal ion to be plated is reduced with a reducing agent in a plating solution and deposited on a substrate under metallic state. In order to start and accelerate the above described reducing reaction on the surface of a substrate, it has been carried out to subject the substrate to a pretreatment whereby a metal such as palladium, gold or platinum is adsorbed on the surface to give a catalytic activity thereto. This method can be applied to various substrates as is well known, but, for the purpose of increasing the adhesiveness of a plating, in general, it has been proposed to roughen the surface of a substrate chemically or mechanically to thus increase the anchor effect. For example, the surface roughening is carried out by immersing a substrate in a solution of strong acid or strong alkali such as a mixed solution of a bichromate and sulfuric acid or sodium hydroxide, or by subjecting a substrate to mechanical polishing such as blasting or tumbling.

Of late, various studies have been made on a method of producing a magnetic recording medium comprising forming a ferromagnetic metal thin film as a magnetic recording layer by electroless plating or by electroplating further on an electroless plating. One of advantages obtained by forming a ferromagnetic metal thin film as a magnetic recording layer of a magnetic recording medium is that it is possible to use a magnetic recording layer with a thin thickness due to a large saturated magnetic flux density and to obtain a relatively high coercive force suitable for a high density recording. Another advantage obtained by the use of a thin film of ferromagnetic metal is to obtain readily the film with a thin and uniform thickness by electroplating, electroless plating, etc. In the case of providing a thin film of ferromagnetic metal as a magnetic recording layer, however, the surface smoothness of the thin film is directly affected by that of a substrate due to the feature of being thin, so the above described method of increasing the adhesiveness through the anchor effect is not desirable, which results in difficulties to obtain a metallic thin film excellent in surface smoothness.

In the electroless plating method of the prior art, furthermore, it has been thought necessary to render the surface of a substrate sufficiently hydrophillic and then immerse in a pretreatment solution for activation. The quantity of a noble metal such as palladium, gold or platinum adhered in excess and carried away by the substrate surface rendered hydrophilic in the pretreatment for activation amounts to 100 times or more as much as that required actually for the activation of the surface. The palladium, gold or platinum adhered in excess to the substrate is thus brought into an electroless plating bath, resulting in acceleration of the decomposition of the plating solution.

In the above described prior art method, not only it is difficult to obtain a plating with a good surface smoothness, but also a noble metal such as palladium necessary for the activation of the surface of a substrate is wasted and tends to lower the stability of a plating bath. Therefore, the prior art method is disadvantageous in that a high technique is required for controlling the processing bath which stability is inferior.

For the purpose of forming a magnetic layer, furthermore, various studies or proposals have hitherto been made on the adhesiveness, surface smoothness and processing stability of a metallic thin film prepared by plating. For example, a method of providing an active surface for chemical plating by forming a metallic film through vapor deposition in vacuo or the like, or a method of providing an electrically conductive surface for electroplating is known as disclosed in Japanese Patent Publication No. 9490/1969, Japanese Patent Application (OPI) Nos. 97876/1974 and 6308/1975, U.S. Pat. No. 3,801,368, etc. Another proposal for the activation of the surface of a substrate is, for example, disclosed in Japanese Patent Publication No. 22983/1967 (U.S. Pat. No. 3,525,635) in which the activation is carried out by forming a thin continuous undercoated layer consisting of an insulating polymer in which colloidal metallic particles are uniformly dispersed capable of giving a nucleus forming surface for chemical plating. The similar methods are disclosed in Japanese Patent Publication Nos. 29242/1968, 126679/1970 and 37646/1970, Japanese Patent Application (OPI) Nos. 78038/1973, 53537/1974, 63623/1974 and 73337/1974 and U.S. Pat. No. 3,594,229.

The above described method for activating the surface of a substrate by undercoating need not utilize the anchor effect unlike the prior art activation method by chemical processing using stannous chloride or palladium chloride. Consequently, a metallic thin film apparently excellent in surface smoothness can be obtained with a good stability of processing because a noble metal adhered in excess is hardly brought into a chemical plating bath. In the above described method for activating the surface of a substrate by undercoating, however, the undercoating is generally carried out by dispersing a noble metal such as gold, silver, platinum or palladium in a polymer and a portion in which the noble metal can be utilized as nuclei for chemical plating is thus limited to only a surface portion of the undercoated layer, resulting in increase of the cost per unit area. Since water or hydrogen chloride is often added to an undercoating solution of a high molecular material and organic solvent for the purpose of dissolving a noble metal salt, the adhesion of the undercoated layer to a substrate is not always strong. Furthermore, such a difficulty in dispersing sufficiently a noble metal in a high molecular material results often in pinholes in a metallic thin film deposited by chemical plating. Another proposal for the activation of the surface of a substrate is disclosed in Japanese Patent Publication No. 7843/1968 in which the activation is carried out by processing a surface to be plated with a catalyst consisting of a solution of a palladium chloride complex with water and hydrogen halide dissolved in an organic solvent before immersing in a plating bath. In the above described method for processing a substrate to be plated with a mixed solution of water and an organic solvent containing palladium chloride, the substrate to be surface activated is much limited and the bonding strength of the palladium chloride complex to the substrate is unstable due to hydration so that a metallic thin film deposited by chemical plating has often a poor adhesiveness.

Methods comprising providing an undercoated layer on a substrate and effecting plating on the undercoated layer are disclosed in Japanese Patent Publication Nos. 19467/1964, 10239/1970, 4071/1971, 21921/1971, 33161/1973 and 34161/1973 and Patent Application (OPI) Nos. 10530/1972 and 57925/1975. These methods, however, aim at improving the adhesiveness at the expense of the surface smoothness by providing an undercoated layer and etching for the surface roughening or by dispersing metallic fine particles in an undercoated layer and, therefore, cannot be applied to the production of a magnetic recording medium using a magnetic plating layer as a recording layer.

SUMMARY OF THE INVENTION

It is an object of the invention to provide a method of forming a metallic thinfilm by electroless plating, whereby the above described disadvantages can be overcome.

It is another object of the invention to provide a method of forming a metallic thin film excellent in adhesiveness as well as surface smoothness by electroless plating with a low cost.

It is a further object of the invention to strengthen the adhesion of a metallic thin film formed by electroless plating to a substrate sheet so as to be suitable for magnetic recording media.

These objects can be attained by a method of forming a metallic thin film on a plastic substrate by electroless plating, which comprises providing an undercoated layer consisting mainly of polyvinylidene chloride or vinylidene chloride copolymer on the surface of the substrate and then subjecting to a surface activating treatment and electroless plating.

DETAILED DESCRIPTION OF THE INVENTION

The inventors have made various studies on a method of effecting electroless plating on a plastic substrate and consequently have found that a metallic thin film being excellent in metallic lustre as well as adhesiveness can be obtained by providing an undercoated layer consisting mainly of polyvinylidene chloride or a vinylidene chloride copolymer on a plastic substrate and then subjecting the undercoated layer directly to an activation pretreatment without chemical or mechanical surface roughening treatment and to an electroless plating treatment. The present invention is based on this finding. According to the present invention, no surface roughening treatment is required and a plating film markedly excellent in surface smoothness can be obtained by the levelling effect due to the undercoated layer. Furthermore, the surface of the undercoated layer according to the present invention is not hydrophilic, nor wetted even if immersed in water. Therefore, in the pretreatment for activation, an excessive quantity of the liquor is not carried away and a plating bath is scarcely deteriorated and shows a lengthened life.

The polyvinylidene chloride or vinylidene chloride copolymer used in the present invention has generally a softening point of 100° to 200° C and a degree of polymerization of 1,000 or less, preferably 300 to 500. In particular, vinylidene chloride-vinyl chloride copolymers and vinylidene chlorideacrylonitrile copolymers are preferable. The copolymerization ratio of vinylidene chloride is generally 98 to 8% by weight, preferably 95 to 18% by weight. The above described polymer or copolymer may be partially halogenated, for example, chlorinated. In the undercoated layer, there can be incorporated various additives such as plasticizers, heat stabilizers, adhesion improving agents to plastic substrates such as polyesters, etc. in addition to polyvinylidene chloride or vinylidene chloride copolymer. In this case, these additives are preferably added in a proportion of 50% or less to the polyvinylidene chloride or vinylidene chloride copolymer. The thickness of the undercoated layer is preferably 0.2 to 2 $\mu$ and the surface roughness thereof, depending upon the object of plating, is 0.5 $\mu$ or less, preferably 0.1 $\mu$ or less in the case of providing a plating layer for a magnetic recording medium. The surface roughness can be measured by the use of a stylus-type roughness tester or by the optical method.

Useful examples of the plastic substrate used in the present invention are ABS (acrylonitrile-butadiene-styrene) resins, epoxy resins, cellulose acetates, nitrocellulose, ethyl cellulose, methyl cellulose, polyamides, polymethyl methacrylates, polytetrafluoroethylenes, polytrifluoroethylene, polymers or copolymers of $\alpha$-olefins such as ethylene and propylene, polymers or copolymers of vinyl chloride, polycarbonates, polyimides and polyesters such as polyethylene terephthalate and polyethylene naphthalate.

The surface activation treatment in the present invention comprises generally subjecting a surface to be plated to a treatment to adsorb a noble metal such as palladium, gold or platinum having a catalytic activity for electroless plating, which can preferably be carried out by sensitization using Sensitizer comprising a hydrochloric acidic solution of stannous chloride as disclosed in U.S. Pat. No. 2,702,253, followed by activation using Activator comprising a noble metal ion such as of palladium, gold, silver or platinum. In the present invention, there can also be used a surface activation treatment comprising using Catalyst (Pd-Sn sol liquor) and then Accelerator, as described in U.S. Pat. Nos. 3,011,920 and 3,532,518.

The preferable compositions of Sensitizer and Activator used in the present invention are as follows:

Sensitizer $SnCl_2$: 0.16–150 g/l
HCl: 0.8–200 ml/l
A suitable surfactant can be added.

Activator

Noble metal ion (Pd, Au, etc.): 0.0001–0.012 mol/l
HCl: 3–20 ml/l
A suitable surfactant or acetone can be added.

The preferable compositions of Catalyst and Accelerator used in the present invention are as follows:

Catalyst $Sn^{+2}$ ion: 0.01–0.98 mol/l
$Sn^{+4}$ ion: 0–0.02 mol/l
Noble metal ion (Pd, Au, etc.): 0.0001–0.012 mol/l
HCl: 0.5–350 ml/l

Accelerator

5–50% Aqueous solution of perchloric acid, sulfuric acid, phosphoric acid, sodium hydroxide, sodium carbonate, sodium pyrophosphate, ammonium fluoride, hydrofluoric acid or mixtures thereof.

The electroless plating bath used in the invention can contain ordinarily (a) cobalt, nickel, iron and/or other metal ions to form a metallic film, (b) a reducing agent such as hypophosphite, borohydride compound, hydrazine or formalin, (c) a complexing agent such as malonic acid, succinic acid, tartaric acid, citric acid, boric acid or ammonium salts thereof and optionally (d) a pH buffering agent such as formic acid or a pH regulator such as sodium hydroxide, ammonium hydroxide or sodium carbonate. In the case of providing a magnetic layer for a magnetic recording medium by plating, a metallic layer consisting mainly of Co or Co-Ni with a film thickness of 0.05 to 2.0 μm is formed. In the case of effecting electroplating, it is necessary to form previously an electroless plating layer of nickel or copper on an undercoated layer and even in the case of providing a magnetic layer by electroless plating, it is preferable to form previously an electroless plating layer of nickel or copper. A preferable magnetic electroless plating bath consists of an aqueous solution containing 0.02 to 0.6 mol/l of cobalt ions, 0 to 0.02 mol/l of nickel ions, 0.03 to 0.4 mol/l of a reducing agent such as hypophosphite ion and suitable amounts of a complexing agent, pH buffering agent and pH regulator. Furthermore, small amounts of additives can be incorporated therein to improve the properties of the magnetic film. Methods of producing magnetic recording media are disclosed in U.S. Pat. Nos. 3,116,159, 3,138,479, 3,219,471, 3,227,635, 3,238,061, 3,267,017, 3,353,986, 3,360,397, 3,362,893, 3,416,932, 3,446,657, 3,549,417, 3,578,571, 3,637,471 and 3,672,968. These methods can also be used in the present invention.

According to the present invention, there is provided a method of forming a metallic thin film being excellent in surface smoothness as well as adhesiveness on a plastic substrate by electroless plating, which method is particularly available for the production of magnetic recording media by plating.

The present invention will be further illustrated in greater detail in the following examples and comparative examples. It will be self-evident to those skilled in the art that the ratios, ingredients in the following formulations and the order of operations can be modified within the scope of the present invention. Therefore, the present invention is not to be interpreted as being limited to the following examples.

EXAMPLE 1

Three sheets of ABS resin having a smooth surface and a thickness of 5 mm were prepared and used as a substrate for plating. The one sheet was washed with a neutral detergent, then washed adequately with water and subjected to a surface activation treatment using the following treating solutions to give a Sample A.

Sensitizer: in 1,000 ml $SnCl_2.2H_2O$: 10 g
HCl: 40 ml

Activator: in 1,000 ml $PdCl_2$: 0.25 g
HCl: 10 ml

The other sheet was washed with a neutral detergent, surface-roughened with the following etching solution, then washed adequately with water and subjected to a surface activation treatment using the above described treating solutions to give a Sample B.

Etching Solution: in 1,000 ml $K_2Cr_2O_7$: 90 g
$H_2SO_4$: 600 ml

The third sheet was washed with a neutral detergent, washed with water, dried and then coated with a solution with a solid content of 2% by weight, obtained from a vinylidene chloride-vinyl chloride copolymer (vinylidene chloride/vinyl chloride ratio: 20/80% by weight; degree of polymerization: 450; softening point: 130° C) and butyl acetate as a solvent, uniformly to give a thickness of 0.4 μm on dry base. The sheet processed in this way was then subjected to a surface activation treatment with the above described treating solutions to obtain a Sample C.

The thus surface activated Samples A, B and C were then subjected to copper plating using the following electroless plating solution.

Electroless Copper Plating Solution: in 1,000 ml

Copper sulfate ($CuSO_4.5H_2O$): 29 g
Potassium sodium tartrate ($KNaC_4H_4O_6.4H_2O$): 140 g
Sodium hydroxide (NaOH): 40 g
Formalin (37% aqueous solution): 166 ml
pH 11.5, Temperature 25° C In the case of Sample A, the plating film was partly stripped during the plating and the plating was not favourably carried out. In the case of Sample B, an adhesion test using a Cellotape (commercial name) showed that a good plating film was formed, but observation by an interference microscope showed a considerable rough surface. The undercoated surface of Sample C was not hydrophilic, but permitted a very lustrous plating and showed the similar adhesiveness to Sample B in an adhesion test by a Cellotape. In the observation by an interference microscope, it was also found that the plating surface of Sample C had a better surface smoothness than the initial ABS resin surface.

EXAMPLE 2

Onto a polyethylene terephthalate film (hereinafter referred to as "PET film") having a thickness of 25 μm was uniformly coated a solution with a solid content of 3% by weight, obtained by mixing 30 parts of an amorphous linear polyester (main components: 0.8 mol of isophthalic acid, 0.2 mol of sebacic acid and 1 mol of ethylene glycol; mean molecular weight, 17,000; limit viscosity: 0.54 (measured at 30° C in 0.5% by weight solution in phenol/tetrachloroethane (6/4))) with 70 parts of a vinylidene chloridevinyl chloride copolymer (vinylidene chloride/vinyl chloride ratio: 30/70% by weight; degree of polymerization: 480; softening point: 140° C) and dissolving the mixture in a mixed solvent of methyl ethyl ketone/cyclohexane (9/1 by weight), to give a thickness of 1.2 μm on dry base. The thus undercoated PET film was then subjected to a surface activation treatment by immersing in order in Catalyst 6F and Accelerator 19 for 2.5 minutes each and thereafter subjected to a magnetic plating by the following plating bath and plating conditions to obtain a plating thickness of 0.12 μm.

Cobalt sulfate ($CoSO_4.7H_2O$): 0.08 mol/l
Sodium hypophosphite ($NaH_2PO_2.H_2O$): 0.3 mol/l Potassium sodium tartrate ($KNaC_4H_4O_6 \cdot 4H_2O$): 0.4 mol/l
Ammonium sulfate (($NH_4)_2SO_4$): 0.5 mol/l
Boric acid ($H_3BO_3$): 0.9 mol/l
pH: 9.5 (adjusted by NaOH)
Temperature: 50° C The resulting magnetic tape had magnetic properties, i.e., a coercive force of 585 Oe and squareness ratio of 0.79, which plating surface was uniform and very lustrous and showed a sufficient adhesiveness as a magnetic tape.

COMPARATIVE EXAMPLE 1

The procedure of Example 2 was repeated except that PET film was subjected to an etching treatment by immersing in an aqueous solution of 10 mol/l of sodium hydroxide warmed at 80° C for 5 minutes in place of the undercoating of PET film. When the plating surface was observed by a scanning electron microscope, the tape of Comparative Example 1 had a worse surface smoothness and more uneven surface due to etching unevenness than the tape of Example 2. Both the tapes were substantially similar in adhesion and did not show stripping of the magnetic layers even when subjected to running in a VTR. When the outputs were measured by means of EIAJ (Electronic Industries Association of Japan) Type I VTR, the tape of Example 2 having a good surface smoothness showed a higher output by 3 dB at a short wavelength of 6 MHz.

EXAMPLE 3

Onto a polyethylene naphthalate film (hereinafter referred to as "PEN film") with a thickness of 20 μm was coated uniformly a solution with a solid content of 1% by weight, obtained from a vinylidene chloride-acrylonitrile copolymer (vinylidene chloride/acrylonitrile ratio: 80/20 by weight; degree of polymerization: 500; softening point: 130° C) and a mixed solvent of methyl ethyl ketone/tetrahydrofuran (8/2), to give a thickness of 0.8 μm on dry base. The thus undercoated PEN film was then surface activated by immersing in the following Sensitizer and Activator for 1.5 minutes each.

Sensitizer: in 1,000 ml $SnCl_2 \cdot 2H_2O$: 20 g
HCl: 10 ml
$CH_3(CH_2)_{11}OSO_3Na$; 0.02 g Activator: in 1,000 ml $PdCl_2$: 0.5 g
HCL: 5 ml Thereafter, the PEN film was subjected to magnetic plating to obtain a film thickness of 0.18 μm using the following plating solution.
Cobalt chloride ($CoCl_2 \cdot 6H_2O$): 0.04 mol/l
Nickel chloride ($NiCl_2 \cdot 6H_2O$): 0.002 mol/l
Sodium hypophosphite ($NaH_2PO_2 \cdot H_2O$): 0.05 mol/l
Ammonium chloride ($NH_4Cl$): 0.2 mol/l
Citric acid ($H_3C_6H_5O_7 \cdot H_2O$): 0.13 mol/l
Boric acid ($H_3BO_3$): 0.50 mol/l
pH: 7.5 (adjusted by NaOH)
Temperature: 80° C Thus a magnetic plating film consisting mainly of Co and Ni and having a coercive force of 630 Oe and squareness ratio of 0.76 was obtained.

COMPARATIVE EXAMPLE 2

The procedure of Example 3 was repeated except that the PEN film was treated with the following etching solution in place of the undercoating treatment of the PEN film.

Etching solution: in 1,000 ml $CrO_3$: 65 g
$H_2SO_4$: 400 ml
$H_3PO_4$: 80 ml

When the plating was carried out without the above described etching treatment, a stable plating was not obtained due to a phenomenon such that a part of plating film was peeled during the plating.

When the magnetic plating film of Example 3 and the magnetic plating film of Comparative Example 2 were observed and compared by means of an interference microscope, the former showed a more smooth surface. Both the magnetic films had a substantially similar adhesiveness, which was sufficient as a magnetic recording medium.

When the plating was continuously carried out in Example 3 and Comparative Example 2, the magnetic plating solution was deteriorated in a shorter time in Comparative Example 2, which life was only ½ of that of Example 3.

EXAMPLE 4

Onto a PET film with a thickness of 22 μm was uniformly a solution with a solid content of 4% by weight obtained by mixing 20 parts of a polyester consisting of 0.4 mol of ethylene glycol, 0.6 mol of triethylene glycol and 1 mol of terephthalic acid (ethyl chloride solution with a solid content of 2%; limit viscosity at 30° C: 0.43; molecular weight: about 13,000) and 80 parts of a vinylidene chloride-acrylonitrile copolymer (91/9% by weight, degree of polymerization: 450; softening point: 120° C) and dissolving the mixture in a mixed solvent of methyl ethyl ketone and cyclohexane (8/2) to give a thickness of 1 μm on dry base. The PET film undercoated in this way was then immersed in the following surface activating solutions described in U.S. Pat. No. 3,011,920 for 4 minutes each.

Catalyst: in 1000 ml $PdCl_2$: 1 g
$NaSnO_3 \cdot 3H_2O$: 1.5 g
$SnCl_2 \cdot 2H_2O$: 37.5 g
Hcl: 300 ml Accelerator: in 1000 ml NaOH: 5 mol After the activation treatment, the PET film was subjected to Ni plating using the following plating solution to give a film thickness of 0.3 μm.
Nickel sulfate ($NiSO_4 \cdot 7H_2O$): 0.08 mol/l
Sodium hypophosphite ($NaH_2PO_2 \cdot 6H_2O$): 0.4 mol/l
Potassium sodium tartrate ($KNaC_4H_4O_6 \cdot 4H_2O$): 0.24 mol/l
Ammonium sulfate (($NH_4)_2SO_4$): 0.3 mol/l
Boric acid ($H_3BO_3$): 0.96 mol/l
pH: 9.0
Temperature: 45° C The plated film was further subjected to electroplating using the following plating solution thus obtaining a magnetic layer consisting mainly of Co and Ni and having a thickness of 0.2 μm. This magnetic plating film showed a coercive force of 435 Oe and squareness ratio of 0.73. The adhesiveness or strength of the plating film was sufficient as a magnetic recording medium. Moreover, the plating film had a marked metallic lustre and surface smoothness which was better than that of the initial Pet film as a result of observation by a microscope.

It will clearly be understood from the above described Examples and Comparative Examples that a plating film excellent in surface smoothness as well as adhesiveness can be obtained by providing on a plastic substrate an undercoated layer consisting essentially of polyvinylidene chloride or a vinylidene chloride copolymer, subjecting the undercoated layer to an activation treatment directly without surface roughening and then to electroless plating. According to the present invention, furthermore, an electroless plating bath can be used with a less deterioration or with a lengthened life.

What is claimed is:

1. A method of forming a metallic thin film on a plastic substrate by electroless plating which consists essentially of
   (a) providing on a surface of the substrate an undercoated layer of a vinylidene chloride copolymer selected from the group consisting of vinylidene chloride-vinyl chloride copolymers and vinylidene chloride-acrylonitrile copolymers, the vinylidene chloride copolymer having a softening point of 100° to 200° C and a degree of polymerization of at most 1000 and having a vinylidene chloride content of 8 to 98% by weight,
   (b) subjecting the surface of the layer to surface activating treatment of (1) sensitizing the surface with a sensitizer solution containing hydrochloric acid and stannous chloride followed by activation with an activator containing a noble metal ion, or (2) contacting the surface with a catalyst containing stannous and noble metal ions followed by contacting the surface with an accelerator, and
   (c) subjecting the resulting surface to electroless plating in an electroless plating bath containing 0.02 to 0.6 mol/l of cobalt ion, 0 to 0.02 mol/l of nickel ion and 0.03 to 0.4 mol/l of hypophosphite ion, optionally with a complexing agent, pH buffering agent and pH regulator, whereby metal ions are deposited on the surface.

2. The method of claim 1, wherein the sensitizer contains 0.16–150 g/l of stannous chloride and 0.8–200 m/l of hydrochloric acid and the activator contains 0.0001–0.012 mol/l of a noble metal ion and 3–20 ml/l of hydrochloric acid.

3. The method of claim 1, wherein the catalyst contains 0.01–0.98 mol/l of stannous ion, 0–0.02 mol/l of stannic ion, 0.0001–0.012 mol/l of a noble metal ion and 0.5–350 ml/l of hydrochloric acid and the accelerator contains 5–50% of at least one member selected from the group consisting of perchloric acid, sulfuric acid, phosphoric acid, sodium hydroxide, sodium carbonate, sodium pyrophosphate, ammonium fluoride, hydrofluoric acid and mixtures thereof.

4. The method of claim 1, wherein the vinylidene chloride copolymer contains 95 to 18% by weight of vinylidene chloride component.

5. The method of claim 1, wherein the undercoated layer contains, in addition, at most 50% by weight of additives based on the polyvinylidene chloride or vinylidene chloride copolymer.

6. The method of claim 5, wherein the additives is selected from the group consisting of plasticizers, heat stabilizers and adhesion improving agents to plastic substrates.

7. The method of claim 1, wherein the undercoated layer has a thickness of 0.2 to 2 $\mu$m.

8. The method of claim 1, wherein the plastic substrate is of polyethylene terephthalate or polyethylene naphthalate.

9. The method of claim 1, wherein a magnetic thin film is formed by the electroless plating.

10. The method of claim 9, wherein the magnetic thin film consists essentially of cobalt of cobalt-nickel.

11. The method of claim 9, wherein the magnetic thin film has a thickness of 0.05 to 2.0 $\mu$m.

12. The method of claim 1, wherein the undercoated layer has a surface roughness of at most 0.5 $\mu$m.

* * * * *